United States Patent
Chen

(10) Patent No.: US 10,554,150 B2
(45) Date of Patent: Feb. 4, 2020

(54) THREE-LEVEL INVERTER

(71) Applicant: FUJI ELECTRIC CO., LTD., Kawasaki (JP)

(72) Inventor: Shuangching Chen, Kawasaki (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 0 days.

(21) Appl. No.: 16/235,755

(22) Filed: Dec. 28, 2018

(65) Prior Publication Data

US 2019/0140555 A1 May 9, 2019

Related U.S. Application Data

(63) Continuation of application No. PCT/JP2017/043527, filed on Dec. 4, 2017.

(30) Foreign Application Priority Data

Jan. 18, 2017 (JP) .................. 2017-007128

(51) Int. Cl.
*H02M 7/487* (2007.01)
*H02M 1/00* (2006.01)
(Continued)

(52) U.S. Cl.
CPC ........ *H02M 7/487* (2013.01); *H01L 29/1608* (2013.01); *H01L 29/872* (2013.01); *H02M 1/00* (2013.01)

(58) Field of Classification Search
CPC .......... H02M 1/00; H02M 7/44; H02M 7/483; H02M 7/487; H01L 29/1608; H01L 29/872

See application file for complete search history.

(56) References Cited

U.S. PATENT DOCUMENTS 9,685,888 B2 * 6/2017 Ogawa .................. H01L 25/18
2012/0025794 A1 2/2012 Inoue et al.
(Continued)

FOREIGN PATENT DOCUMENTS

JP 2012-130224 A 7/2012
JP 2013-165498 A 8/2013
(Continued)

OTHER PUBLICATIONS

International Search Report dated Feb. 20, 2018 in corresponding International Application No. PCT/JP2017/043527.
(Continued)

*Primary Examiner* — Matthew V Nguyen

(57) ABSTRACT

A three-level inverter includes a first semiconductor switching element disposed between a direct-current high potential terminal and an alternating-current output terminal, a second semiconductor switching element disposed between a direct-current low potential terminal, which is paired with the direct-current high potential terminal, and the alternating-current output terminal, first and second reflux diodes which are disposed reverse-parallelly with the first and second semiconductor switching elements, respectively, and a semiconductor circuit which controls gate voltages of the first and second semiconductor switching elements by selectively applying thereto a direct-current intermediate voltage which is given to a direct-current intermediate potential terminal. Inductance elements are connected in series to the first and second reflux diodes, respectively.

9 Claims, 5 Drawing Sheets

(51) Int. Cl.
*H01L 29/872* (2006.01)
*H01L 29/16* (2006.01)

(56) References Cited

U.S. PATENT DOCUMENTS

| | | |
|---|---|---|
| 2012/0155135 A1 | 6/2012 | Fujii |
| 2015/0085548 A1* | 3/2015 | Takao .................. H02M 3/155 363/131 |
| 2016/0028224 A1* | 1/2016 | Yamada ................ H02M 7/487 363/56.11 |
| 2016/0192495 A1 | 6/2016 | Nakamura et al. |
| 2017/0054360 A1 | 2/2017 | Uemura |
| 2017/0187304 A1* | 6/2017 | Fujii ..................... H02M 7/003 |
| 2017/0237359 A1* | 8/2017 | Ohnishi ................ H02M 7/483 363/131 |

FOREIGN PATENT DOCUMENTS

| | | | |
|---|---|---|---|
| JP | 2014-57520 A | 3/2014 | |
| JP | 2015-2564 A | 1/2015 | |
| JP | 2016-123259 A | 7/2016 | |
| WO | WO-2013145854 A1 * | 10/2013 | ............ H02M 7/487 |
| WO | 2016/038721 A1 | 3/2016 | |

OTHER PUBLICATIONS

Written Opinion of the International Searching Authority dated Feb. 20, 2018 in corresponding International Application No. PCT/JP2017/043527.

* cited by examiner

THREE-LEVEL INVERTER

CROSS-REFERENCE TO RELATED APPLICATIONS

This application is a Continuation of PCT Application No. PCT/JP2017/043527 filed Dec. 4, 2017, which claims the benefit of Japanese Patent Application No. 2017-007128 filed Jan. 18, 2017. The disclosures of the prior applications are hereby incorporated by reference herein in their entireties.

TECHNICAL FIELD

The present invention relates to a three-level inverter configured to convert a direct-current voltage into an alternating-current voltage.

BACKGROUND ART

An inverter has been known as a power conversion device configured to convert a direct-current voltage into an alternating-current voltage. Particularly, in recent years, as compared to a two-level inverter configured to obtain an alternating-current output by generating PWM pulse voltages of ±Ed having a zero point as a center from a direct-current voltage Ed, a three-level inverter has attracted more attention which is configured to obtain an alternating-current output by generating two types of PWM pulse voltages of ±Ed and ±(Ed/2) having a zero point as a center.

FIG. 5 depicts a schematic configuration of a so-called T-NPC (T-type Neutral Point Clamped) three-level inverter 1. The three-level inverter 1 is configured to switch a direct-current voltage Ed, which is applied between a direct-current high potential terminal P and a direct-current low potential terminal N, by a voltage clamped with a direct-current intermediate voltage (Ed/2), thereby generating the PWM pulse voltages of the two-step voltages in an alternating-current output terminal AC. The PWM pulse voltages are wave-filtered (filtering) by an LC filter (not shown), for example, so that an alternating-current voltage is generated. A waveform of the alternating-current voltage generated by the three-level inverter 1 is similar to a sinusoidal waveform smoother than a waveform of an alternating-current voltage that is to be generated by the two-level inverter.

Specifically, the three-level inverter 1 includes a first semiconductor switching element T1 provided between the direct-current high potential terminal P and the alternating-current output terminal AC and configured to be turned on/off during a positive voltage output mode, and a first reflux diode D1 connected reverse-parallelly with the first semiconductor switching element T1. Also, the three-level inverter 1 includes a second semiconductor switching element T2 provided between a direct-current low potential terminal N, which is paired with the direct-current high potential terminal P, and the alternating-current output terminal AC and configured to be turned on/off during a negative voltage output mode, and a second reflux diode D2 connected reverse-parallelly with the second semiconductor switching element T2. For reference, the first and second semiconductor switching elements T1, T2 are respectively configured by a high breakdown voltage IGBT (Insulated Gate Bipolar Transistor), for example. Also, the first and second reflux diodes D1, D2 are respectively configured by a bipolar diode based on Si.

Also, the three-level inverter 1 includes a bidirectional switch circuit BSW provided between a direct-current intermediate potential terminal M and the alternating-current output terminal AC. The bidirectional switch circuit BSW is configured by a so-called RB-IGBT (Reverse Blocking IGBT) in which third and fourth semiconductor switching elements T3, T4 each of which is configured by an IGBT having a reverse breakdown voltage are connected reverse-parallelly with each other. Also, the direct-current intermediate potential terminal M is applied with a direct-current intermediate voltage (Ed/2), which is obtained by dividing the direct-current voltage Ed by capacitors C1, C2 provided in series between the direct-current high potential terminal P and the direct-current low potential terminal N.

The bidirectional switch circuit BSW functions to change voltages, which are respectively applied to the first and second semiconductor switching elements T1, T2 by selectively applying the direct-current intermediate voltage (Ed/2) given to the direct-current intermediate potential terminal M to the alternating-current output terminal AC, by two steps as the voltage Ed or the voltage (Ed/2).

The basic operations of the three-level inverter 1 configured as described above are described in detail in JP-A-2012-130224, for example. For reference, a power conversion device configured to obtain a three-phase alternating-current output includes three sets of the three-level inverters 1 provided in parallel, and is configured to drive the three-level inverters 1 with a phase difference of 120°, thereby generating a three-phase alternating-current voltage consisting of U phase/V phase/W phase.

JP-A-2014-57520 suggests using, as the first and second reflux diodes D1, D2, a unipolar diode based on silicon carbide (SiC), which is a wide bandgap semiconductor, instead of the general bipolar diode of the related art based on silicon (Si). As disclosed in JP-A-2014-57520, when the unipolar diodes (SiC diodes) are used as the first and second reflux diodes D1, D2, it is possible to suppress a switching loss, i.e., a so-called recovery loss associated with reverse recovery operations of the first and second semiconductor switching elements T1, T2.

In the three-level inverter configured as described above, when the second semiconductor switching element T2 is turned off in a state where the direct-current voltage Ed is applied, for example, a reverse recovery current may flow for minor time of 1 μs or shorter via the first reflux diode D1, which is originally in an off state, in association with the reverse recovery operation of the second semiconductor switching element T2. This phenomenon similarly occurs when the first semiconductor switching element T1 is turned off in the state where the direct-current voltage Ed is applied. In this case, a reverse recovery current flows for minor time of 1 μs or shorter via the second reflux diode D2, which is originally in an off state, in association with the reverse recovery operation of the first semiconductor switching element T1.

For reference, the reverse recovery current flowing via the first reflux diode D1 is a factor of causing a high surge voltage Vcep in the second semiconductor switching element T2. When a circuit inductance of a current pathway is denoted as L and a turn-off current is denoted as [di/dt], the surge voltage Vcep is expressed as follows.

$$Vcep = (Ed/2) + L \times |di/dt|$$

Also, when the surge voltage Vcep is higher than the direct-current voltage Ed, the reverse recovery current after turn-off of the second semiconductor switching element T2, which originally flows toward the direct-current intermediate potential terminal M via the bidirectional switch circuit BSW, is likely to flow toward the direct-current high potential terminal P via the first reflux diode D1 configured by the unipolar diode. That is, since a circuit impedance (inductance component) between the direct-current intermediate potential terminal M and the alternating-current output terminal AC is greater than a circuit impedance (inductance component) between the direct-current high potential terminal P and the alternating-current output terminal AC, the turn-off current is likely to flow through the first reflux diode D1.

Due to the current, the steep voltage change is caused in the first reflux diode D1, so that the first reflux diode D1 may break down. Furthermore, due to the steep voltage change caused in the first reflux diode D1, a frequency component thereof is applied to the first semiconductor switching element via a parasitic capacitance Cres of the first semiconductor switching element T1, so that a steep change in gate voltage may be caused. The steep change in gate voltage is a factor of gate breakdown of the first semiconductor switching element T1. Also, the current flowing via the first reflux diode D1 is an occurrence factor of loss in the inverter.

Similarly, the turn-off current of the first semiconductor switching element T1, which flows toward the direct-current intermediate potential terminal M via the bidirectional switch circuit BSW, is likely to flow toward the direct-current low potential terminal N via the second reflux diode D2 configured by the unipolar diode. Therefore, upon the turn-off of the first semiconductor switching element T1, the similar problems to upon the turn-off of the second semiconductor switching element T2 are caused.

SUMMARY

An aspect of the present invention provides a three-level inverter having a simple configuration and capable of preventing unnecessary flow of reflux current via a reflux diode upon turn-off of a semiconductor switching element, thereby facilitating reduction of loss.

According to an embodiment of the present invention, there is provided a three-level inverter including:

a first semiconductor switching element provided between a direct-current high potential terminal and an alternating-current output terminal and configured to be turned on/off during a positive voltage output mode;

a first reflux diode disposed reverse-parallelly with the first semiconductor switching element;

a second semiconductor switching element provided between a direct-current low potential terminal, which is paired with the direct-current high potential terminal, and the alternating-current output terminal and configured to be turned on/off during a negative voltage output mode;

a second reflux diode disposed reverse-parallelly with the second semiconductor switching element;

a semiconductor circuit configured to control gate voltages of the first and second semiconductor switching elements by changing a potential of the alternating-current output terminal, in correspondence to a direct-current intermediate voltage obtained by dividing a direct-current voltage to be applied between the direct-current high potential terminal and the direct-current low potential terminal; and first and second inductance elements connected in series to the first and second reflux diodes, respectively.

For reference, the first and second inductance elements function to increase circuit impedances against reflux currents to flow via the first and second reflux diodes.

According to the three-level inverter configured as described above, the first and second inductance elements are respectively connected in series to the first and second reflux diodes. By the inductance elements, the circuit impedances against currents to flow via the first and second reflux diodes are increased. As a result, an inductance between the direct-current intermediate potential terminal M and the alternating-current output terminal AC becomes smaller than an inductance between the direct-current high potential terminal P and the alternating-current output terminal AC and an inductance between the direct-current low potential terminal N and the alternating-current output terminal AC. Thereby, upon turn-off of the first and second semiconductor switching elements, the current is difficult to flow via the first and second reflux diodes, and mainly flows toward the direct-current intermediate potential terminal.

Each of the first and second semiconductor switching elements may be a high breakdown voltage insulated gate semiconductor device configured by an IGBT or the like, for example, and each of the first and second reflux diodes may be configured by a unipolar semiconductor device. Specifically, each of the first and second reflux diodes configured by the unipolar semiconductor devices is configured by a SiC diode, for example.

The semiconductor circuit may be implemented as a bidirectional switching circuit including third and fourth semiconductor switching elements connected reverse-parallelly with each other and provided between a direct-current intermediate potential terminal to which the direct-current intermediate voltage is to be applied and the alternating-current output terminal, for example. Alternatively, the semiconductor circuit may be implemented as a bidirectional switching circuit provided between a direct-current intermediate potential terminal to which the direct-current intermediate voltage is to be applied and the alternating-current output terminal and including a third semiconductor switching element and a fourth semiconductor switching element connected in series with an energization direction being set as a reverse direction and third and fourth diodes connected reverse-parallelly with the third and fourth semiconductor switching elements, respectively.

In the meantime, when the semiconductor circuit includes an auxiliary switching circuit having a fifth semiconductor switching element provided between the first semiconductor switching element and the alternating-current output terminal and a sixth semiconductor switching element provided between the second semiconductor switching element and the alternating-current output terminal, the semiconductor circuit may be implemented as a diode circuit configured to selectively apply the direct-current intermediate voltage between both ends of the auxiliary switching circuit.

Here, the direct-current intermediate voltage is generated as a direct-current voltage of ½ times of a direct-current voltage, which is obtained by dividing a voltage to be applied between the direct-current high potential terminal and the direct-current low potential terminal by first and second capacitors provided between the direct-current high potential terminal and the direct-current low potential terminal.

According to the above-described three-level inverter, it is possible to prevent the current, which is generated upon turn-off of the semiconductor switching element, from flowing out via the first and second reflux diodes. Therefore, it is possible to facilitate reduction of loss without unnecessarily complicating the configuration.

DETAILED DESCRIPTION OF EMBODIMENTS

Hereinafter, a three-level inverter in accordance with embodiments of the present invention will be described with reference to the drawings.

Figure 1:
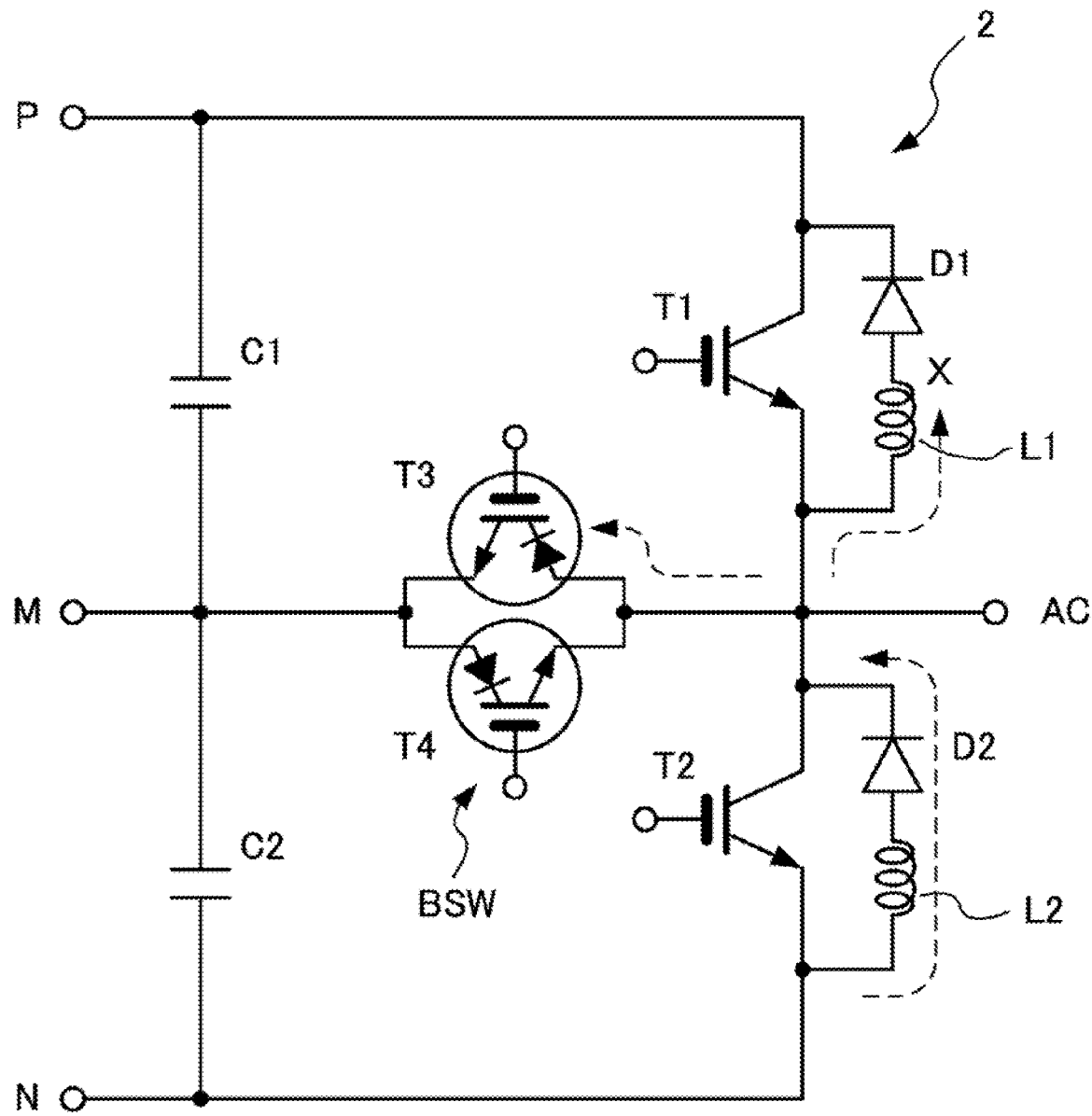
FIG. 1 is a schematic configuration view of a T-NPC three-level inverter in accordance with a first embodiment of the present invention.
Figure 5:
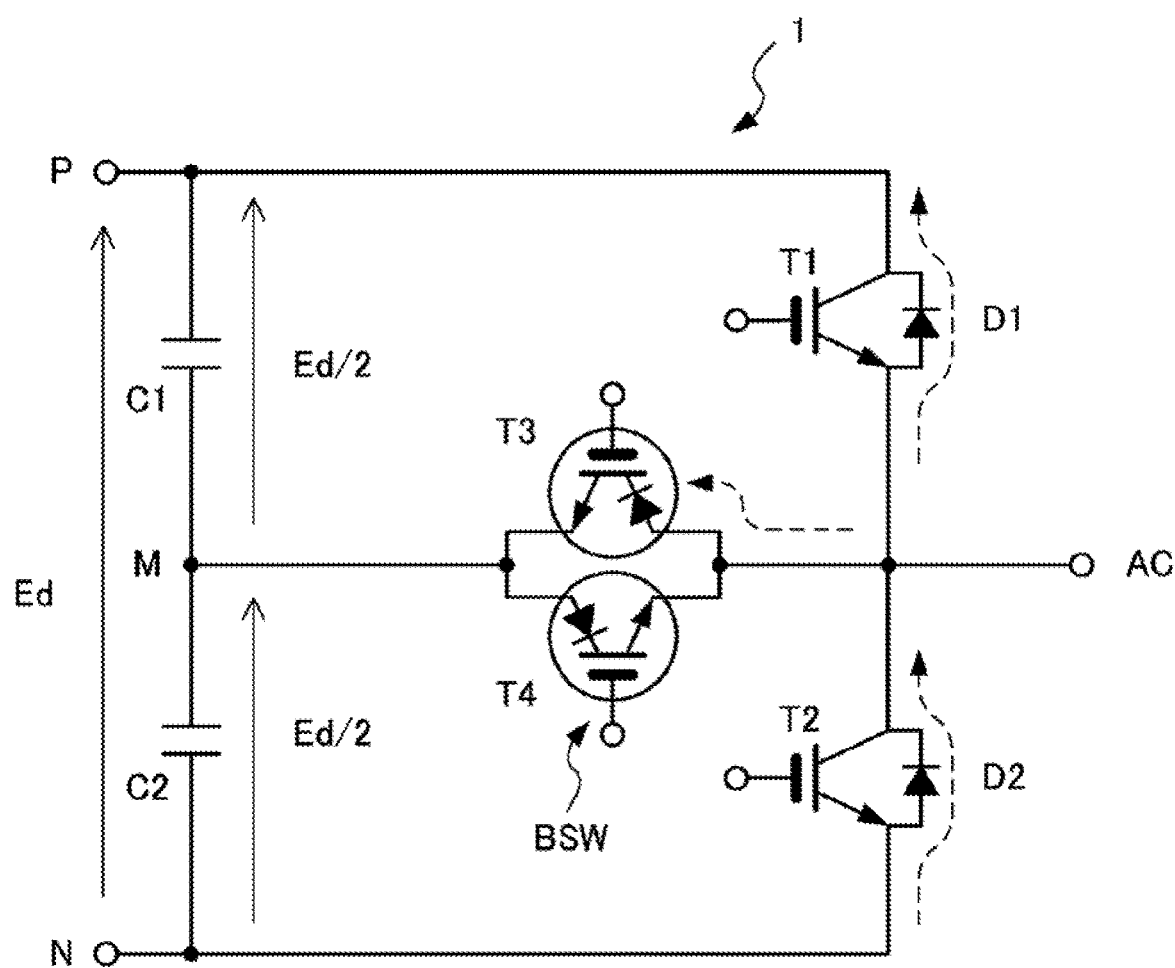
FIG. 5 is a schematic configuration view of a related-art general T-NPC three-level inverter.

FIG. 1 depicts a schematic configuration of a T-NPC three-level inverter 2 in accordance with a first embodiment of the present invention. Like the three-level inverter 1 shown in FIG. 5, the three-level inverter 2 includes a first semiconductor switching element T1 provided between a direct-current high potential terminal P and an alternating-current output terminal AC and configured to be turned on/off during a positive voltage output mode, and a second semiconductor switching element T2 provided between a direct-current low potential terminal N, which is paired with the direct-current high potential terminal P, and the alternating-current output terminal AC and configured to be turned on/off during a negative voltage output mode.

In the meantime, a first reflux diode D1 is disposed reverse-parallelly with the first semiconductor switching element T1, and a second reflux diode D2 is disposed reverse-parallelly with the second semiconductor switching element T2. The first and second reflux diodes D1, D2 are respectively configured by a unipolar diode, which is a wide bandgap semiconductor, specifically, a Schottky barrier diode based on silicon carbide (SiC). In the meantime, in FIG. 1, a void diode symbol indicates a unipolar diode of a wide bandgap semiconductor, and a painted out diode symbol indicates a bipolar diode or unipolar diode of a wide bandgap semiconductor based on Si.

Also, first and second capacitors C1, C2 connected in series are provided between the direct-current high potential terminal P and the direct-current low potential terminal N. The first and second capacitors C1, C2 function to divide a direct-current voltage Ed, which is to be applied between the direct-current high potential terminal P and the direct-current low potential terminal N, generate a direct-current intermediate voltage [Ed/2], and giving the direct-current intermediate voltage [Ed/2] to a direct-current intermediate potential terminal M.

A bidirectional switch circuit BSW as a semiconductor circuit configured to control on/off operating voltages of the first and second semiconductor switching elements T1, T2 by changing a potential of the alternating-current output terminal AC is provided between the direct-current intermediate potential terminal M, to which the direct-current intermediate voltage [Ed/2] is given in the above-described manner, and the alternating-current output terminal AC. The bidirectional switch circuit BSW is configured by a so-called RB-IGBT (Reverse Blocking IGBT) in which third and fourth semiconductor switching elements T3, T4 each of which is configured by an IGBT having a reverse breakdown voltage are connected reverse-parallelly with each other, for example.

Here, a feature of the three-level inverter is that a first inductance element L1 connected in series to the first reflux diode D1 is further provided, in addition to the above configuration. Also, the three-level inverter 2 has a feature that a second inductance element L2 connected in series to the second reflux diode D2 is provided.

For reference, the first and second inductance elements L1, L2 may be independent circuit components such as coils but may also be implemented as a wiring material having a predetermined length when connecting the first and second reflux diodes D1, D2 in a reverse-parallel manner between collectors and emitters of the first and second semiconductor switching elements T1, T2 configured by IGBT, for example.

In the meantime, in FIG. 1, the first and second inductance elements L1, L2 are respectively connected in series to anodes of the first and second reflux diodes D1, D2. However, the first and second inductance elements L1, L2 may be respectively connected in series to cathodes of the first and second reflux diodes D1, D2.

Accordingly, in the above-described three-level inverter, the first and second inductance elements L1, L2 are respectively disposed in series to each of current pathways of the first and second reflux diodes D1, D2 connected reverse-parallelly with the first and second semiconductor switching elements T1, T2. Therefore, it is possible to increase circuit impedances of the current pathways via the first and second inductance elements L1, L2, as compared to a circuit impedance of a current pathway via the bidirectional switch circuit BSW.

Therefore, according to the three-level inverter 2 configured as described above, when the second semiconductor switching element T2 is turned off in a state where the direct-current voltage Ed is applied during the positive voltage output mode, for example, a reverse recovery current, which is to flow in association with a reverse recovery operation of the second semiconductor switching element T2, flows via only the bidirectional switch circuit BSW having the lower circuit impedance. In other words, the reverse recovery current little flows toward the first reflux diode D1. Similarly, when the first semiconductor switching element T1 is turned off in a state where the direct-current voltage Ed is applied during the negative voltage output mode, a reverse recovery current, which is to flow in association with a reverse recovery operation of the first semiconductor switching element T1, flows via only the bidirectional switch circuit BSW having the lower circuit impedance. In other words, the reverse recovery current little flows toward the second reflux diode D2.

As a result, since the reverse recovery current does not flow via the first and second reflux diodes D1, D2, it is possible to suppress the unnecessary energy loss in the first and second reflux diodes D1, D2. Furthermore, since it is possible to prevent the reverse recovery current from flowing via the first and second reflux diodes D1, D2, it is also possible to suppress the high surge voltage Vcep. For this reason, it is possible to prevent vibrations (oscillations) of gate voltages in the first and second semiconductor switching elements T1, T2 and to prevent in advance gate breakdown of the first and second semiconductor switching elements T1, T2. As a result, even when the unipolar diodes are adopted as the first and second reflux diodes, it is possible to effectively reduce the loss in the first and second reflux diodes.

Furthermore, it is possible to easily cope with a circuit inductance including each of the first and second reflux diodes by setting a long wiring length of the first and second reflux diodes to the first and second semiconductor switching elements when modularizing the three-level inverter, for example.

Figure 2A:
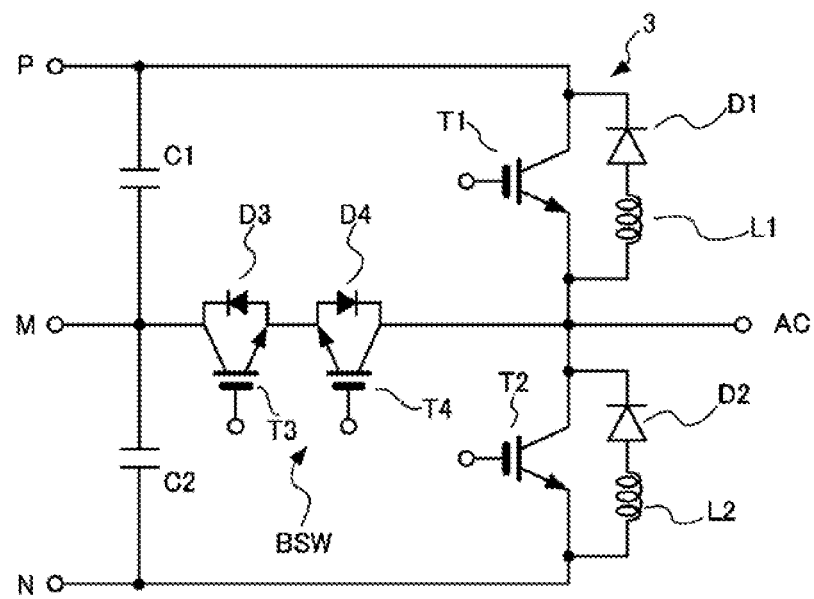
FIGS. 2A to 2C are schematic configuration views of a T-NPC three-level inverter in accordance with a second embodiment of the present invention.
Figure 2B:
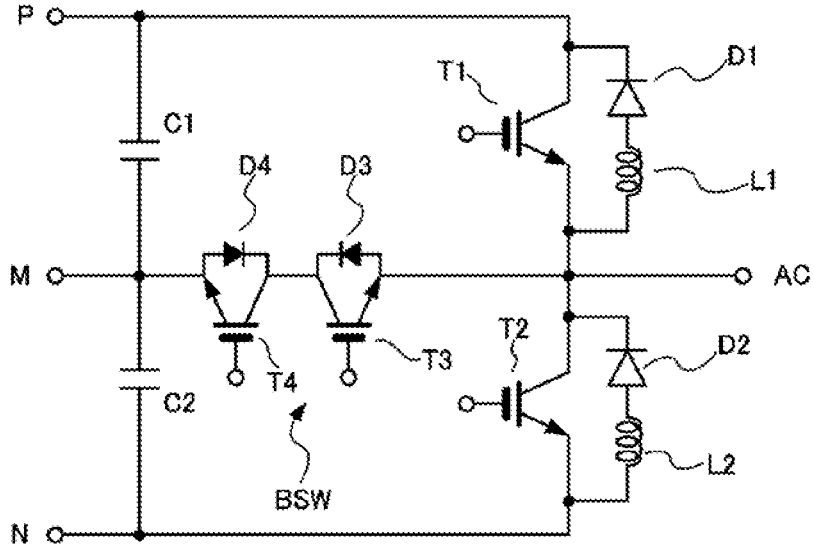

FIGS. 2A and 2B depict a three-level inverter in accordance with s second embodiment of the present invention, respectively. A three-level inverter 3 of the second embodiment is basically configured in the similar manner to the three-level inverter 2 shown in FIG. 1. However, the bidirectional switch circuit BSW provided between the direct-current intermediate potential terminal M and the alternating-current output terminal AC is configured by a third semiconductor switching element T3 and a fourth semiconductor switching element T4 connected in series with an energization direction being set as a reverse direction and configured by a general IGBT, for example, as shown in FIGS. 2A and 2B.

The third and fourth semiconductor switching elements T3, T4 do not have a reverse breakdown voltage, unlike the RB-IGBT. Therefore, third and fourth diodes D3, D4 are connected reverse-parallelly with the third and fourth semiconductor switching elements T3, T4, respectively. In the meantime, the bidirectional switch circuit BSW may have a configuration where a circuit in which the third semiconductor switching element T3 and a diode D3a are connected in series and a circuit in which the fourth semiconductor switching element T4 and a diode D4a are connected in series are connected in parallel with each other, like a modified embodiment shown in FIG. 2C.

Also in the three-level inverter 3 configured as described above, the inductance elements L1, L2 are connected in series to the first and second reflux diodes D1, D2, like the three-level inverter 2 shown in FIG. 1.

Figure 2C:
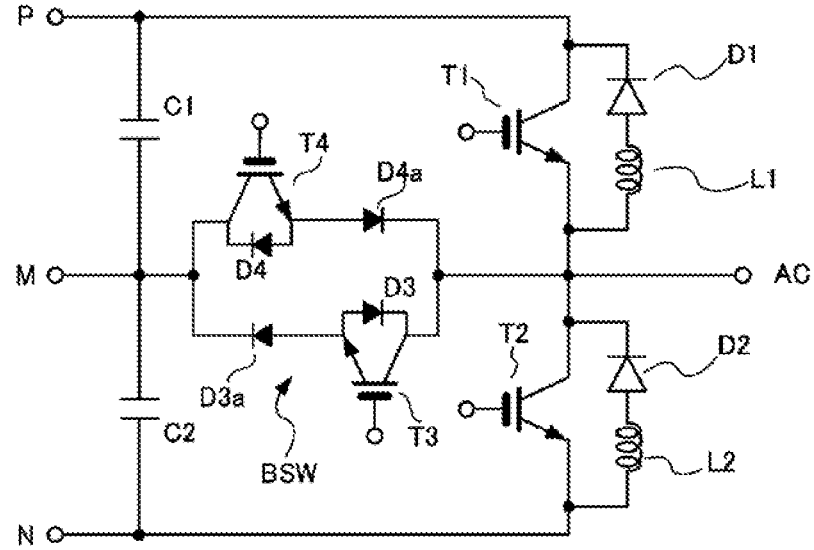

Therefore, also in the three-level inverter 3 having the configuration shown in FIGS. 2A, 2B and 2C, it is possible to increase the circuit impedances of the current pathways via the first and second reflux diodes D1, D2, like the three-level inverter 2 described with reference to FIG. 1. For this reason, when the first and second semiconductor switching elements T1, T2 are turned off, it is possible to prevent the flow of the instantaneous reverse recovery current, and to enable the entire reverse recovery current to flow toward the direct-current intermediate potential terminal M via the bidirectional switch circuit BSW. Accordingly, it is possible to suppress the unnecessary power consumption of the reverse recovery current via the first and second reflux diodes D1, D2 and to reduce the switching loss (recovery loss).

Figure 3:
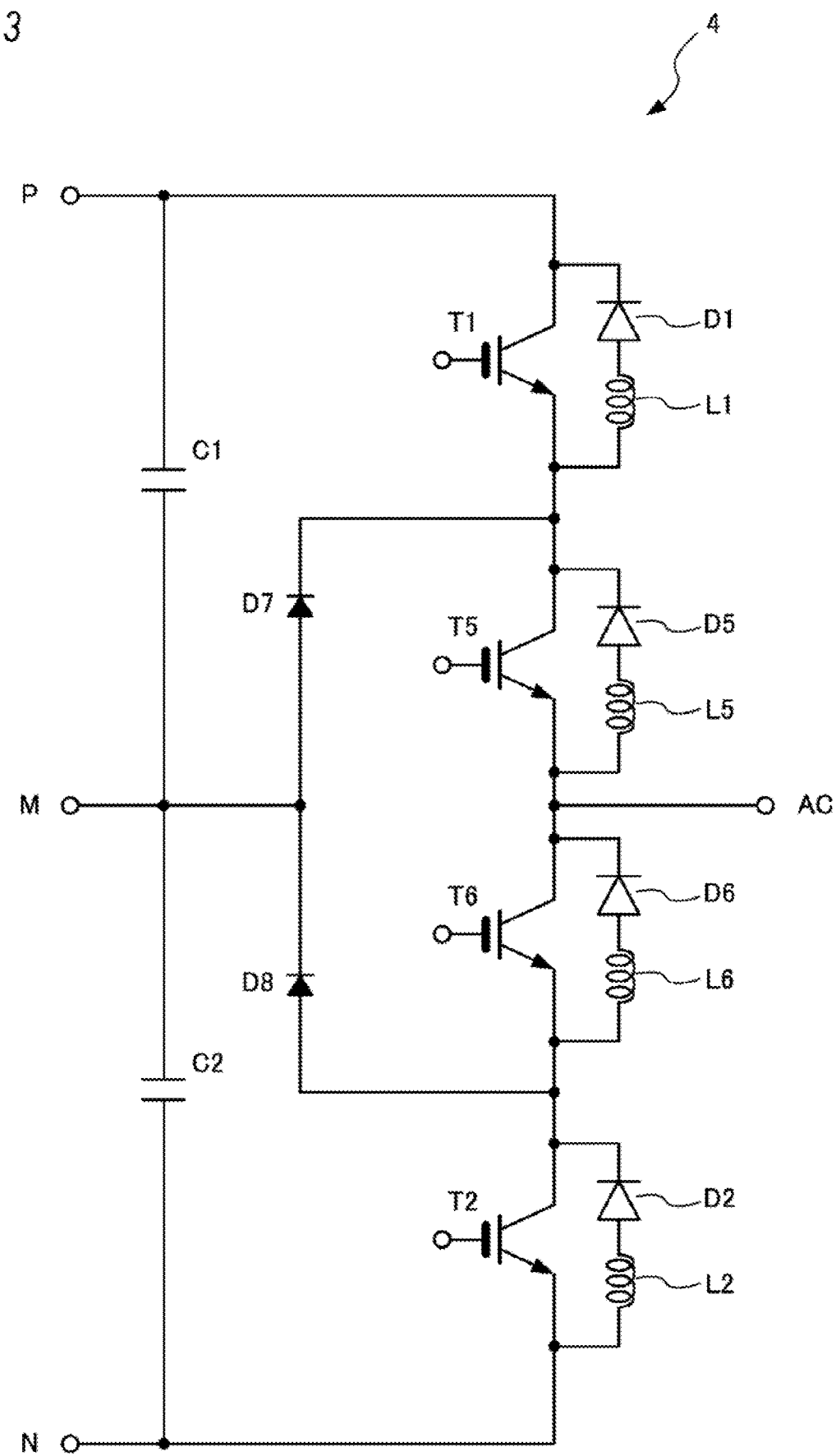
FIG. 3 is a schematic configuration view of an NPC three-level inverter in accordance with a third embodiment of the present invention.
Figure 4:
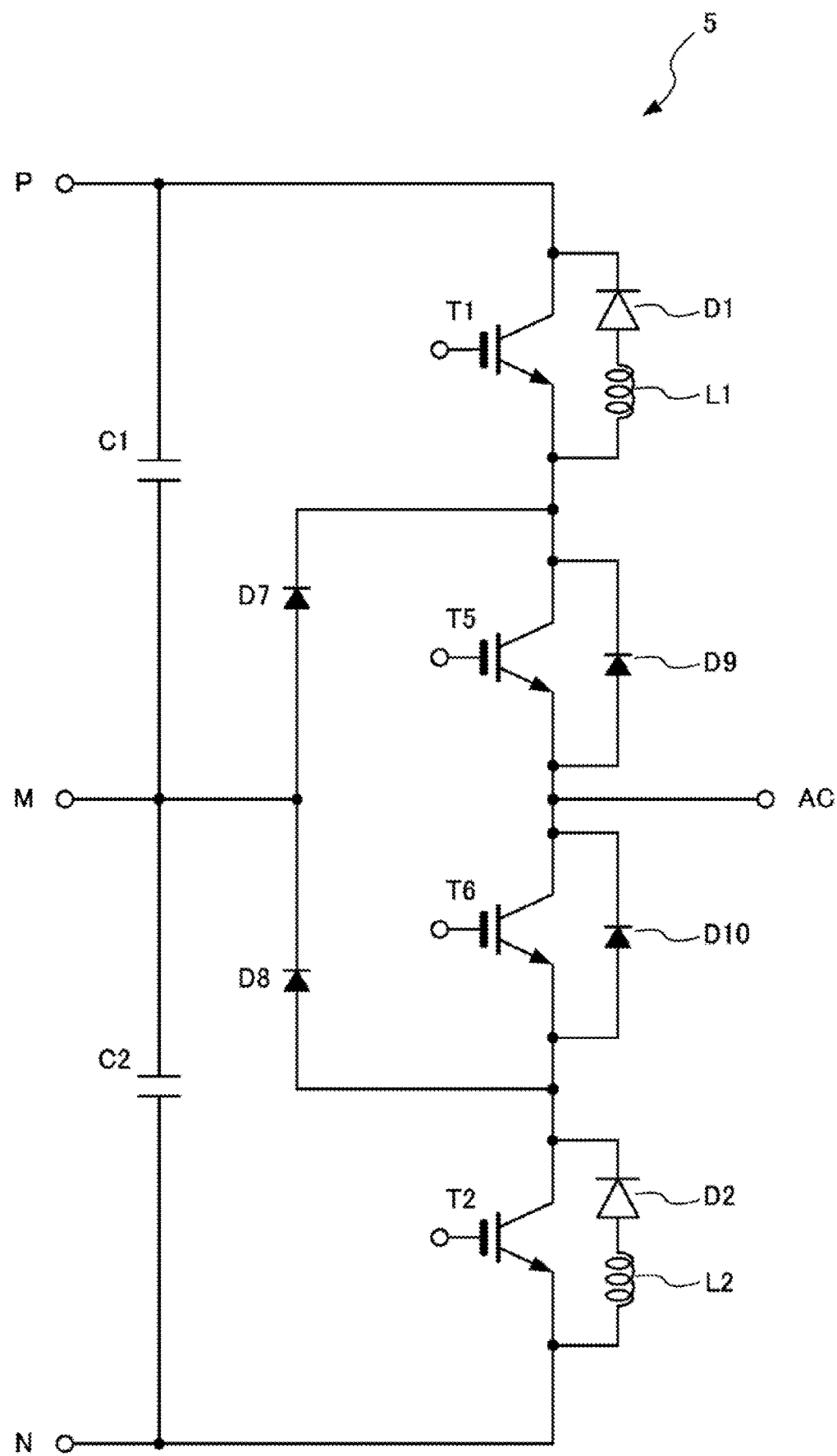
FIG. 4 is a schematic configuration view of an NPC three-level inverter in accordance with a fourth embodiment of the present invention.

Subsequently, third and fourth embodiments of the present invention are described. The three-level inverter is implemented as an NPC (Neutral Point Clamped) three-level inverter 4, 5, as shown in FIGS. 3 and 4.

Specifically, the NPC three-level inverter 4, 5 includes a fifth semiconductor switching element T5 provided between the first semiconductor switching element T1 and the alternating-current output terminal AC and a sixth semiconductor switching element T6 provided between the second semiconductor switching element T2 and the alternating-current output terminal AC. In the meantime, fifth and sixth reflux diodes D5, D6 are connected reverse-parallelly with the fifth and sixth semiconductor switching element T5, T6, respectively. For reference, the first, second, fifth and sixth reflux diodes D1, D2, D5, and D6 are respectively configured by a Schottky barrier diode as a unipolar semiconductor based on silicon carbide (SiC), for example.

Also, the three-level inverter 4, 5 is configured to apply the direct-current intermediate voltage (Ed/2) with a diode D7 being interposed in a forward direction at a connection point of the first semiconductor switching element T1 and the fifth semiconductor switching element T5, and to apply the direct-current intermediate voltage (Ed/2) with a diode D8 being interposed in a reverse direction at a connection point of the second semiconductor switching element T2 and the sixth semiconductor switching element T6. The diodes D7, D8 function to steadily clamp voltages, which are to be respectively applied to the first and second semiconductor switching elements T1, T2, by the direct-current intermediate voltage (Ed/2).

Basically, also in the three-level inverter 4 configured as described above, the inductance elements L1, L2, L5, L6 are connected in series to the first, second, fifth and sixth reflux diodes D1, D2, D5, D6 configured by the unipolar semiconductors. In the meantime, in the three-level inverter 5 shown in FIG. 4, the fifth and sixth reflux diodes D5, D6 are configured by general bipolar diodes D9, D10, and only the first and second reflux diodes D1, D2 connected reverse-parallelly with the first and second semiconductor switching elements T1, T2 directly involved in the switching of the direct-current voltage Ed are configured by the unipolar diodes.

Therefore, like the three-level inverters 2, 3 described in the first and second embodiments, also in the three-level inverters 4, 5 configured as described above, it is possible to increase the circuit impedances of the current pathways via the first and second inductance elements L1, L2, as compared to circuit impedances of current pathways via the diodes D7, D8.

Therefore, like the three-level inverters 2, 3 of the first and second embodiments, also in the three-level inverters 4, 5 of the third and fourth embodiments, it is possible to effectively prevent the flow of the reverse recovery current via the first and second reflux diodes D1, D2. Also, it is possible to suppress the generation of the high surge voltage Vcep in the first and second semiconductor switching elements T1, T2. As a result, it is possible to prevent the vibrations (oscillations) of the gate voltages in the first and second semiconductor switching elements T1, T2 and to prevent in advance the gate breakdown of the first and second semiconductor switching elements T1, T2.

Here, the embodiment shown in FIG. 3 depicts a configuration example where the first, second, fifth and sixth semiconductor switching elements T1, T2, T5, T6 are connected in series and integrated as a semiconductor module. Also, the embodiment shown in FIG. 4 depicts an example where the first semiconductor switching element T1 and diode D7 and the second semiconductor switching element T2 and diode D8 are respectively integrated as chopper modules, and the fifth and the sixth semiconductor switching elements T5, T6 are connected in series to the two chopper modules, so that the three-level inverter 5 is configured.

As shown in the examples, the inductance elements L1, L2 function to prevent the turn-off current upon the turn-off of the first and second semiconductor switching elements T1, T2 from flowing via the first and second reflux diodes D1, D2 connected reverse-parallelly with the first and second semiconductor switching elements T1, T2. Therefore, even when the unipolar diodes are used as the first and second reflux diodes D1, D2 so as to reduce the switching loss (recovery loss), it is possible to sufficiently increase the circuit impedances of the current pathways via the first and second reflux diodes D1, D2. For this reason, it is possible to effectively suppress the unnecessary power loss in the first and second reflux diodes D1, D2 by the simple configuration of connecting the inductance elements L1, L2 in series to the first and second reflux diodes D1, D2.

In the meantime, the present invention is not limited to the embodiments. Although the unipolar diodes based on silicon carbide (SiC) are used as the first and second reflux diodes D1, D2, a unipolar diode based on a semiconductor of a gallium nitride-based material, diamond and the like may also be used. Also, the inductance elements L1, L2 may also be implemented by adjusting a length of a wiring material between a plurality of semiconductor modules and conceiving a wiring pattern, and the like. In addition, the present invention can be diversely modified and implemented without departing from the gist thereof.

The invention claimed is:

1. A three-level inverter comprising:
a first semiconductor switching element provided between a direct-current high potential terminal and an alternating-current output terminal and configured to be turned on/off during a positive voltage output mode;
a first reflux diode disposed reverse-parallelly with the first semiconductor switching element;
a second semiconductor switching element provided between a direct-current low potential terminal, which is paired with the direct-current high potential terminal, and the alternating-current output terminal and configured to be turned on/off during a negative voltage output mode;
a second reflux diode disposed reverse-parallelly with the second semiconductor switching element;
a semiconductor circuit configured to control gate voltages of the first and second semiconductor switching elements by changing a potential of the alternating-current output terminal in correspondence to a direct-current intermediate voltage obtained by dividing a direct-current voltage to be applied between the direct-current high potential terminal and the direct-current low potential terminal; and
first and second inductance elements connected in series to the first and second reflux diodes, respectively.

2. The three-level inverter according to claim 1,
wherein each of the first and second semiconductor switching elements is an insulated gate semiconductor device, and each of the first and second reflux diodes is a unipolar semiconductor diode.

3. The three-level inverter according to claim 2,
wherein each of the first and second unipolar reflux diodes is a wide bandgap semiconductor diode.

4. The three-level inverter according to claim 1,
wherein the semiconductor circuit includes a bidirectional switching circuit, the bidirectional switching circuit including third and fourth semiconductor switching elements connected reverse-parallelly with each other and provided between a direct-current intermediate potential terminal to which the direct-current intermediate voltage is to be applied and the alternating-current output terminal.

5. The three-level inverter according to claim 1,
wherein the semiconductor circuit includes a bidirectional switching circuit provided between a direct-current intermediate potential terminal to which the direct-current intermediate voltage is to be applied and the alternating-current output terminal, the bidirectional switching circuit including a third semiconductor switching element and a fourth semiconductor switching element connected in series with an energization direction being set as a reverse direction, and third and fourth diodes connected reverse-parallelly with the third and fourth semiconductor switching elements, respectively.

6. The three-level inverter according to claim 1,
wherein the semiconductor circuit includes:
an auxiliary switching circuit including a fifth semiconductor switching element provided between the first semiconductor switching element and the alternating-current output terminal, and a sixth semiconductor switching element provided between the second semiconductor switching element and the alternating-current output terminal; and
a diode circuit configured to selectively apply the direct-current intermediate voltage between both ends of the auxiliary switching circuit.

7. The three-level inverter according to claim 1,
wherein the direct-current intermediate voltage is generated as a direct-current voltage of ½ times of a direct-current voltage, which is obtained by dividing a voltage to be applied between the direct-current high potential terminal and the direct-current low potential terminal by first and second capacitors provided between the direct-current high potential terminal and the direct-current low potential terminal.

8. A three-level inverter comprising:
a first semiconductor switching element provided between a direct-current high potential terminal and an alternating-current output terminal and configured to be turned on/off during a positive voltage output mode;
a first reflux diode disposed reverse-parallelly with the first semiconductor switching element;
a second semiconductor switching element provided between a direct-current low potential terminal and the alternating-current output terminal and configured to be turned on/off during a negative voltage output mode;
a second reflux diode disposed reverse-parallelly with the second semiconductor switching element;
a semiconductor circuit configured to control gate voltages of the first and second semiconductor switching elements by changing a potential of the alternating-current output terminal in correspondence to a direct-current intermediate voltage obtained at a direct-current intermediate potential terminal between the direct-current high potential terminal and the direct-current low potential terminal; and
first and second inductance elements connected in series to the first and second reflux diodes, respectively, to increase circuit impedances against reflux current flow through the first and second reflux diodes.

9. A three-level inverter comprising:
a first semiconductor switching element provided between a direct-current high potential terminal and an alternating-current output terminal;
a first reflux diode disposed reverse-parallelly with the first semiconductor switching element;
a second semiconductor switching element provided between a direct-current low potential terminal and the alternating-current output terminal;
a second reflux diode disposed reverse-parallelly with the second semiconductor switching element;
a semiconductor circuit configured to control gate voltages of the first and second semiconductor switching elements by changing a potential of the alternating-current output terminal in correspondence to a direct-current intermediate voltage at a direct-current intermediate potential terminal between the direct-current high potential terminal and the direct-current low potential terminal; and
first and second inductance elements connected in series to the first and second reflux diodes, respectively, so that an inductance between the direct-current intermediate potential terminal and the alternating-current output terminal is less than an inductance between the direct-current high potential terminal and the alternating-current output terminal, and an inductance between the direct-current low potential terminal and the alternating current output terminal.

\* \* \* \* \*